(12) United States Patent
Azumi et al.

(10) Patent No.: US 7,120,030 B2
(45) Date of Patent: Oct. 10, 2006

(54) HOUSING STRUCTURE OF VEHICLE-MOUNTED ELECTRONIC EQUIPMENT

(75) Inventors: Isao Azumi, Tokyo (JP); Tetsushi Watanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 272 days.

(21) Appl. No.: 10/665,489

(22) Filed: Sep. 22, 2003

(65) Prior Publication Data

US 2004/0095732 A1 May 20, 2004

(30) Foreign Application Priority Data

Nov. 14, 2002 (JP) ............................. 2002-330178

(51) Int. Cl.
*H05K 5/00* (2006.01)

(52) U.S. Cl. ........................................ 361/752; 361/736

(58) Field of Classification Search ................ 361/797, 361/752, 736; 439/377; 174/50, 50.52, 174/50.53–54, 52.1; 428/920, 921
See application file for complete search history.

(56) References Cited

U.S. PATENT DOCUMENTS

| | | | |
|---|---|---|---|
| 4,585,822 A * | 4/1986 | Streusand | 524/443 |
| 4,811,165 A * | 3/1989 | Currier et al. | 361/716 |
| 4,893,215 A * | 1/1990 | Urushiwara et al. | 361/739 |
| 5,882,954 A * | 3/1999 | Raghava et al. | 438/119 |
| 6,031,732 A | 2/2000 | Koike et al. | |
| 6,375,477 B1 * | 4/2002 | Nishikawa et al. | 439/76.1 |
| 6,445,568 B1 | 9/2002 | Baur et al. | |
| 2002/0006742 A1 * | 1/2002 | Hara et al. | 439/76.2 |
| 2003/0086246 A1 * | 5/2003 | Wakabayashi et al. | 361/728 |

FOREIGN PATENT DOCUMENTS

| | | |
|---|---|---|
| DE | 197 06 790 C2 | 8/1998 |
| DE | 199 11 989 C2 | 10/2000 |
| DE | 199 56 675 A1 | 5/2001 |
| EP | 0 650 315 A2 | 4/1995 |
| JP | 2-25096 A | 1/1990 |
| JP | 8-79936 A | 3/1996 |
| JP | 8-148842 A | 6/1996 |
| JP | 08-148842 A | 6/1996 |
| JP | 8-153986 A | 6/1996 |
| JP | 8 204072 A | 8/1996 |
| JP | 08-204417 A | 8/1996 |
| JP | 11-166639 A | 6/1999 |
| JP | 11-346418 A | 12/1999 |
| JP | 2000-178417 A | 6/2000 |
| JP | 2002-299867 A | 10/2002 |
| JP | 2002-320313 A | 10/2002 |
| WO | WO 9911107 A1 | 8/1996 |

* cited by examiner

*Primary Examiner*—Kamand Cuneo
*Assistant Examiner*—Ivan Carpio
(74) *Attorney, Agent, or Firm*—Sughrue Mion, PLLC

(57) ABSTRACT

A housing structure for vehicle-mounted electronic equipment according to the present invention is superior in heat dissipation, water resistance, heat resistance and vibration resistance. An electronic substrate is temporarily fixed onto an annular circumferential wall part of a cover made of fire retardant resin, and connector contact pins are soldered to the electronic substrate. The electronic substrate is fixed and held between a heat-transfer base and the annular circumferential wall part with screws, and heat generated by a heating part on the electronic substrate is transferred to the base and dissipated. The annular circumferential wall part has an annular groove in which a sealant is inserted, and the base has an annular protrusion snapped into the annular groove.

12 Claims, 6 Drawing Sheets

HOUSING STRUCTURE OF VEHICLE-MOUNTED ELECTRONIC EQUIPMENT

BACKGROUND OF THE INVENTION

1. Field of the Invention

The present invention relates to a housing structure of vehicle-mounted electronic equipment for hermetically accommodating an electronic substrate between a set of cover and base and, more particularly, to a heat resistant, water resistant (waterproof) and vibration resistant housing structure suitable for mass-production.

2. Description of the Related Art

Hitherto, a housing structure is comprised of two pieces in which connectors are integrally formed into one body and an upper case (cover) made of resin, to which an electronic substrate is fixed, is adhesively fixed onto a lower case (base) with an adhesive sealant (see, for example, the Japanese Patent Publication (unexamined) No. 1999-346418).

In another example of conventional housing structure comprised of two pieces, an electronic substrate is accommodated in a housing formed of a case and a cover, and a heat generated by any heating part mounted on the electronic substrate is transferred to the cover and dissipated (see, for example, the Japanese Patent Publication (unexamined) No. 1996-148842).

In a further example, a fire retardant resin made of polybutyleneterephthalate resin mixed with glass fiber reinforcement is employed as vehicle-mounted electrical and electronic parts (see, for example, the Japanese Patent Publication (unexamined) No. 2000-178417).

With regard to heat dissipation from any heating part, a structure is known, in which a heat generated by any heating part fixed onto one face of a double-sided substrate is transferred to the other face via a through-hole-plated hole. The substrate is fixed onto a part of a heat-transfer housing through a heat-transfer elastic-insulating sheet (see, for example, Japanese Patent Publication (unexamined) No. 1996-204072).

In a still further example of a conventional structure, a heat generated by any heating part mounted on an electronic substrate is transferred to a cooling member such as aluminum base and dissipated (see, for example, the Japanese National Publication No. 2001-505000).

While improvement in dissipation of heat generated by the heating part becomes important under the background of highly miniaturizing and integrating the electronic substrate, vehicle-mounted electronic equipment is required to satisfy various requirements such as heat resistance, water resistance, vibration resistance, and mass-production.

However, in the above-mentioned Japanese Patent Publication (unexamined) No. 1999-346418, a problem exists in that the structure is not so constructed as to dissipate any heat generated by the heating part mounted on the electronic substrate.

Another problem exists in that it is not possible to obtain sufficient vibration resistance just by bonding the cover with the base and, moreover, heat resistance and sealing property of the finished products is not always sufficient.

In the structure of the above-mentioned Japanese Patent Publication (unexamined) No. 1996-148842, several problems exist in that any contact pressure is not sufficiently secured between the heating part and the cover, and the heat generated by a large number of heating parts is difficult to be dissipated. The entire structure is not sufficiently waterproof, either.

SUMMARY OF THE INVENTION

The present invention has been made to solve the above-discussed problems and has an object of providing a housing structure that is capable of improving dissipation of heat generated by any heating part and vibration resistance, being mass-produced, accommodating a miniaturized and highly integrated electronic substrate in the housing structure. The housing structure is further capable of being installed in an engine room of a vehicle, and being superior in heat resistance and waterproof.

A housing structure of vehicle-mounted electronic equipment of the invention includes a connector housing into which a large number of contact pins are press-fitted and a counter-connector is inserted, a cover in which a canopy part and an annular circumferential wall part are integrally formed by a fire retardant resin filled with glass filler, an electronic substrate temporarily fixed onto an inner wall of the annular circumferential wall part, and to which the contact pins are connected, and a highly conductive heat-transfer base that is disposed in contact with the electronic substrate so that a heat generated by any heating part mounted on the electronic substrate is transferred and dissipated, and which is provided with mounting lugs for mounting the base on a vehicle body. In this housing structure, the annular circumferential wall part is provided with an annular groove in which a sealant is inserted and with plural screw holes located at the outside of the annular groove. The base is provided with an annular protrusion snapped into the annular groove and has plural through holes located at the outside of the annular protrusion. By inserting fixing screws into the screw holes through the through holes, the electronic substrate is held between the annular circumferential wall part and the base.

As a result, the heating parts disposed on the electronic substrate are fitted on the base so that heat is securely transferred to the base, and vibration resistance is improved by mounting a heavy base on the vehicle body.

The sealant inserted between the cover formed of a fire retardant resin and the base is brought into tight contact with the cover and the base by the integration means. This brings about an advantage of improving the housing structure in the aspect of heat resistance and vibration resistance making the housing structure hermetically sealed and waterproof without fail.

DESCRIPTION OF THE PREFERRED EMBODIMENTS

Embodiment 1

An embodiment according to the present invention is hereinafter described with reference to the accompanying drawings.

Figure 1:
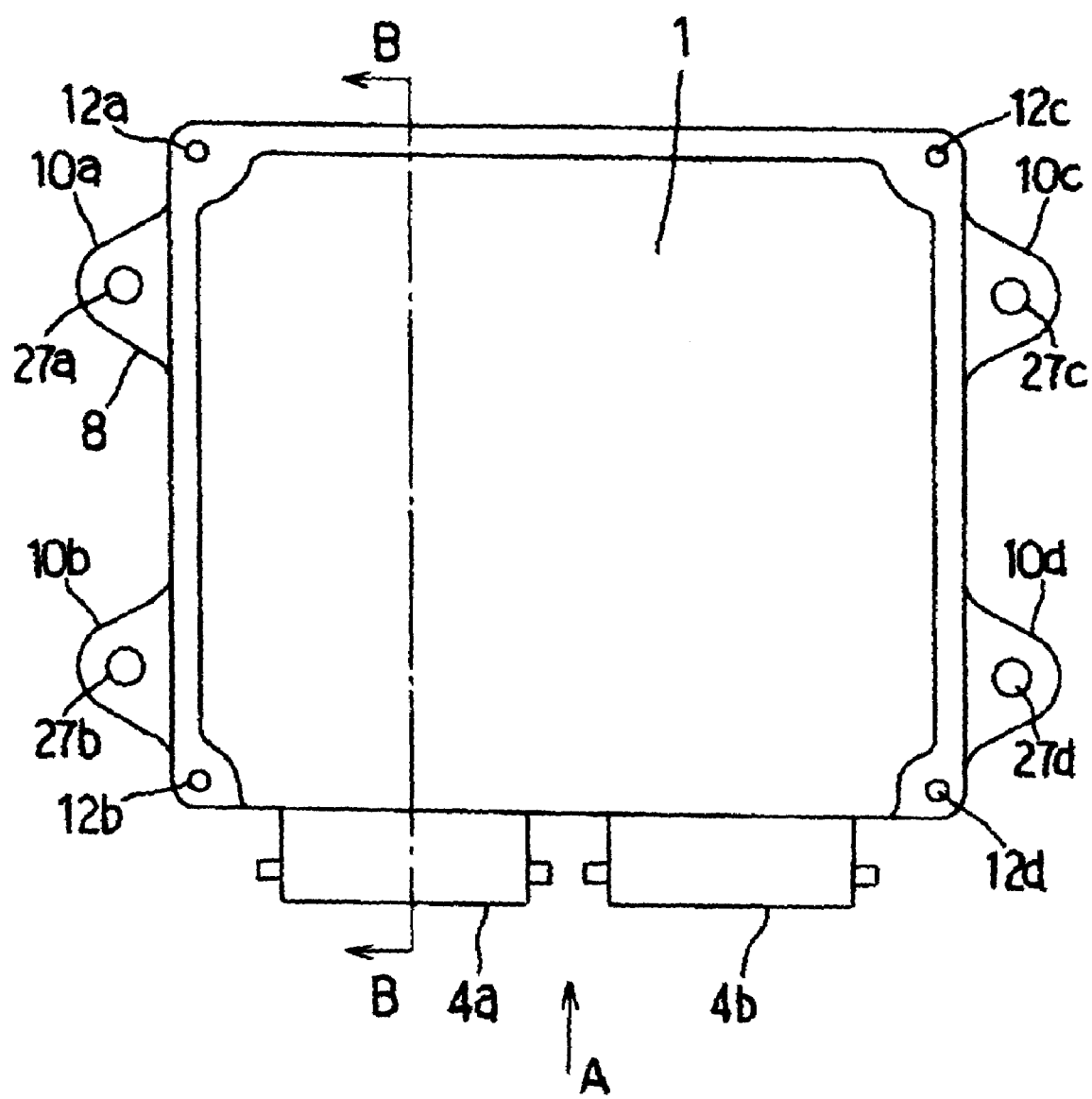
FIG. 1 is a plan view showing a housing structure of vehicle-mounted electronic equipment covered with a canopy part according to Embodiment 1 of the present invention.
Figure 2:
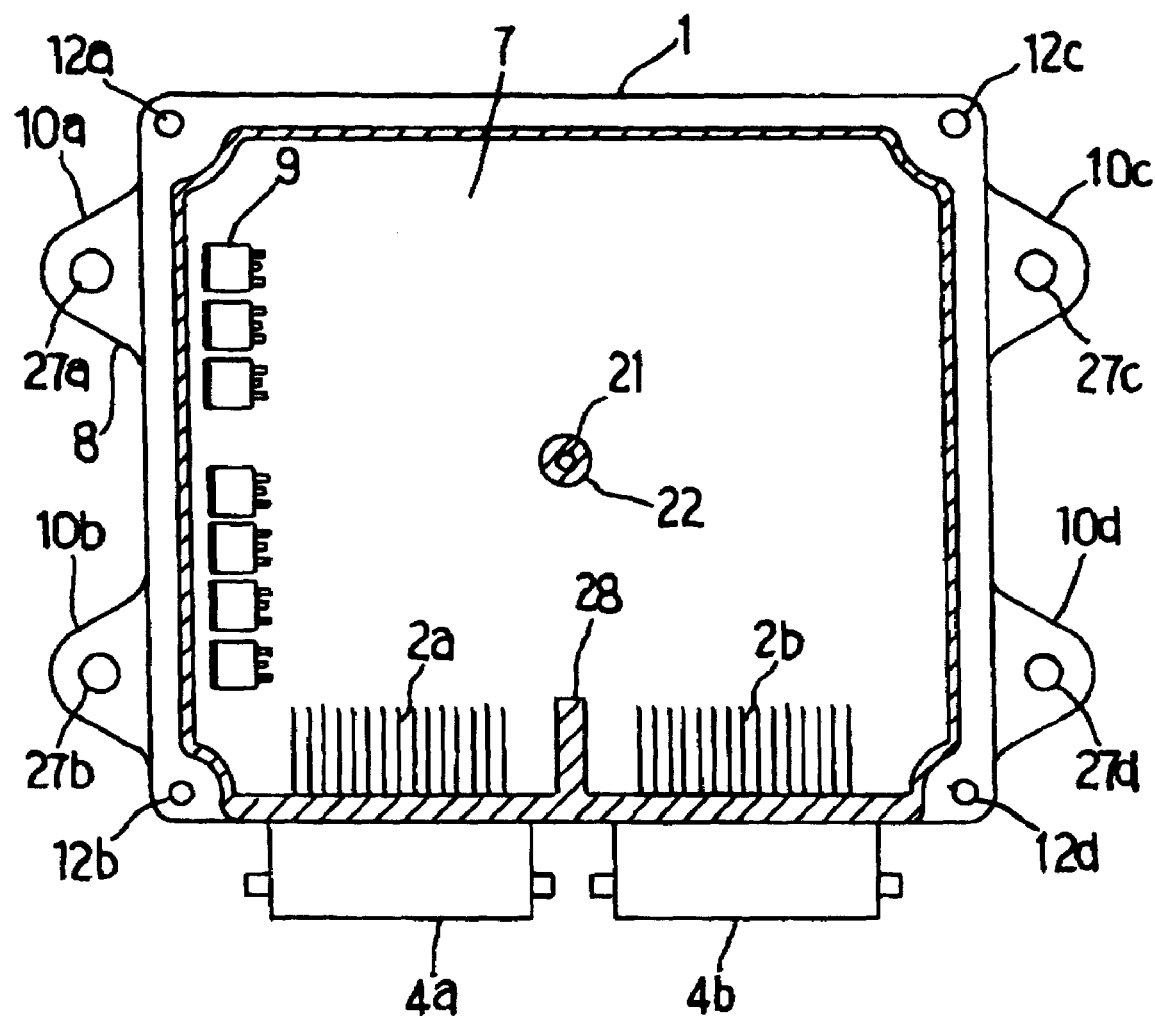
FIG. 2 is a plan view showing the housing structure of vehicle-mounted electronic equipment not covered with a canopy part according to Embodiment 1 of the invention.
Figure 3:
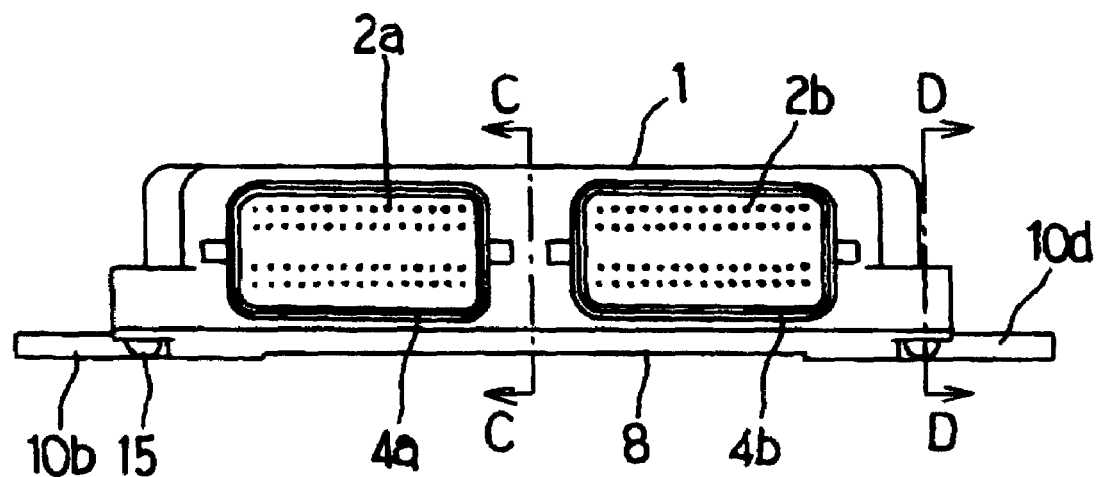
FIG. 3 is a side view showing the housing structure of vehicle-mounted electronic equipment according to Embodiment 1 of the invention.
Figure 4:
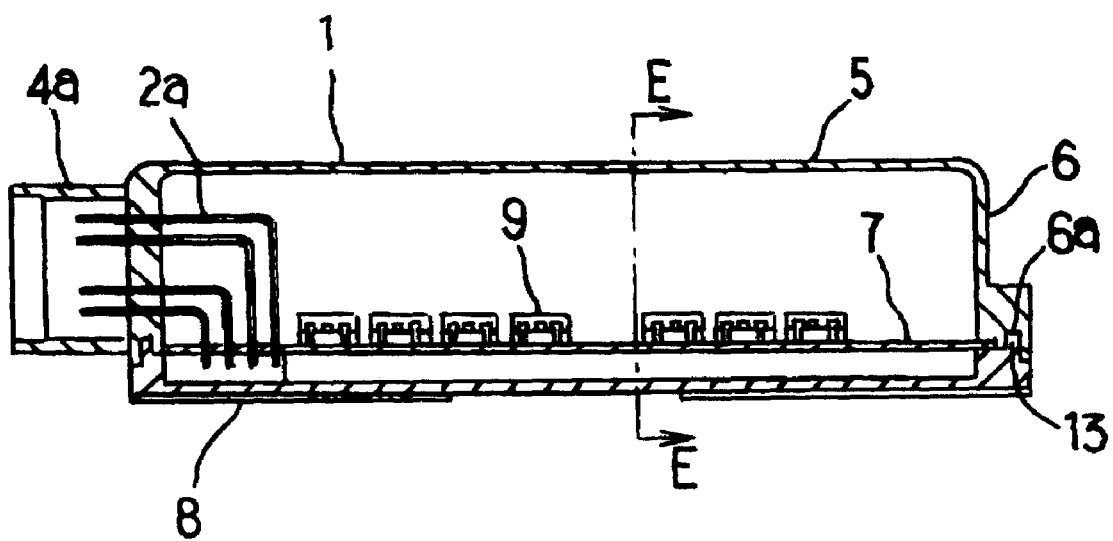
FIG. 4 is a sectional view taken along the line B—B in FIG. 1.
Figure 5:
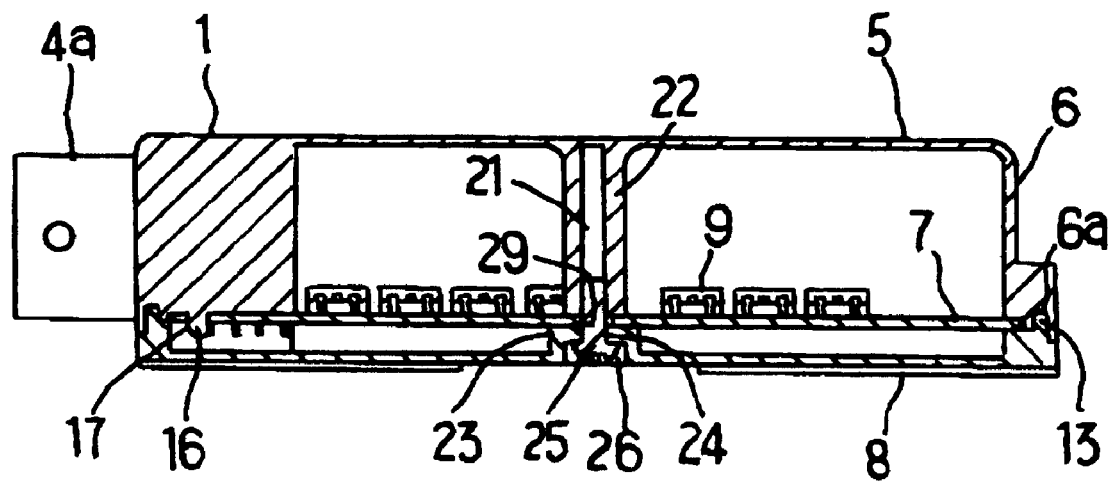
FIG. 5 is a sectional view taken along the line C—C in FIG. 3.
Figure 6:
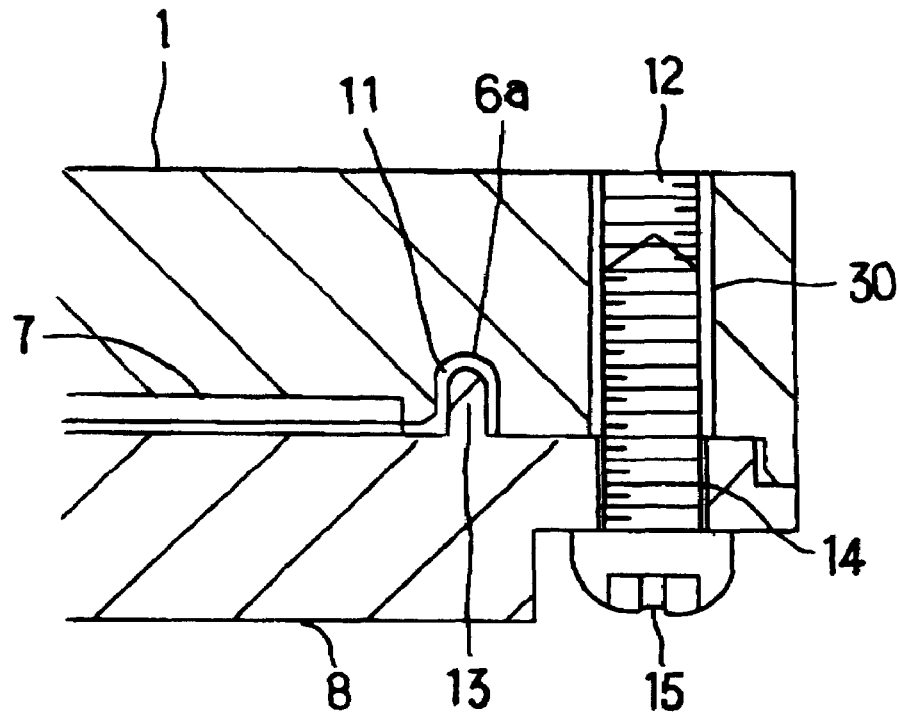
FIG. 6 is a sectional view taken along the line D—D in FIG. 3.
Figure 7:
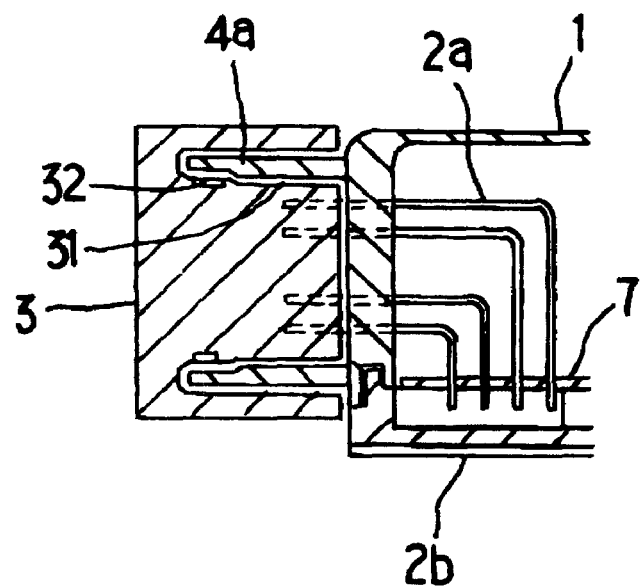
FIG. 7 is an enlarged sectional view showing a connector part.
Figure 8:
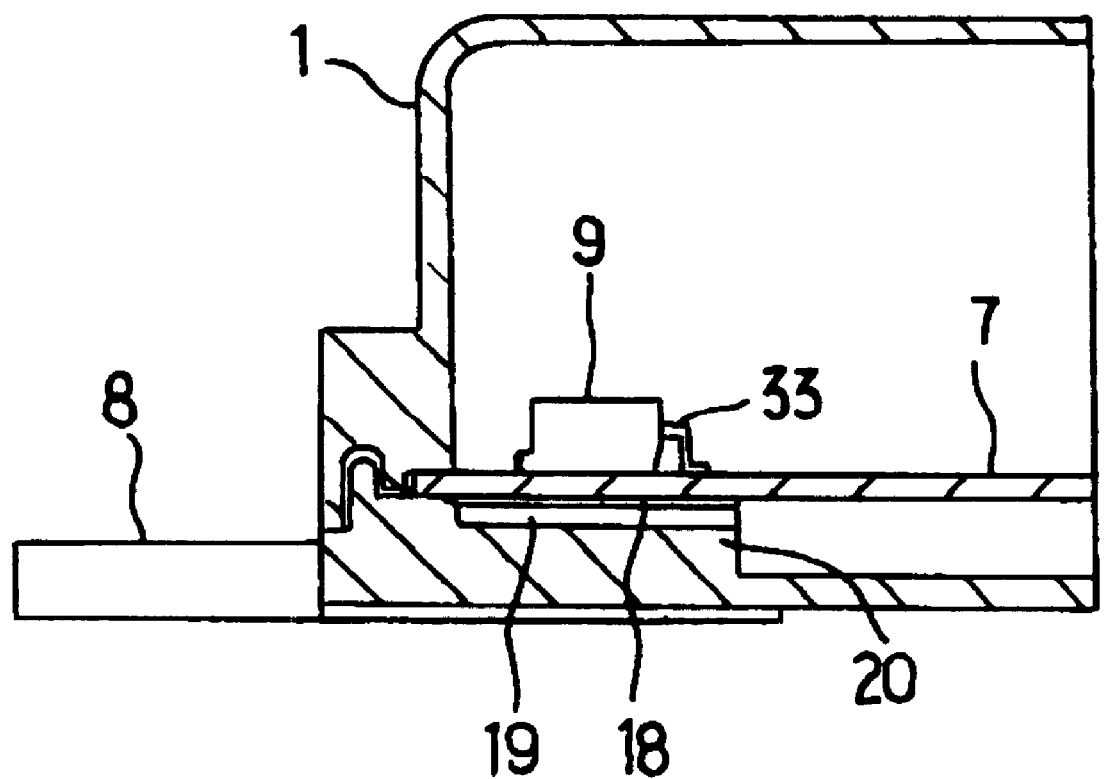
FIG. 8 is a sectional view taken along the line E—E in FIG. 4.

FIG. 1 is a plan view showing a housing structure of vehicle-mounted electronic equipment according to Embodiment 1 of the invention, and FIG. 2 is a plan view showing the housing structure in which a canopy part is removed from the state of FIG. 1. FIG. 3 is a side view taken in the direction of A in FIG. 1, FIG. 4 is a sectional view taken along the line B—B in FIG. 1, and FIG. 5 is a sectional view taken along the line C—C in FIG. 3. FIG. 6 is a sectional view taken along the line D—D in FIG. 3, FIG. 7 is an enlarged sectional view showing a connector part, and FIG. 8 is a sectional view taken along the line E—E in FIG. 4.

In the drawings, a large number of contact pins 2a, 2b are press-fitted into a cover 1, and the cover 1 and connector housings 4a, 4b in which a counter-connector 3 is inserted are integrally formed of a fire retardant resin. The cover 1 is provided with a canopy part 5 and an annular circumferential wall part 6. After the electronic substrate 7 is temporarily fixed onto an inner wall of the annular circumferential wall part 6, the mentioned many contact pins 2a, 2b are connected to an electronic substrate 7. A highly heat-transfer base 8 is disposed in contact with the electronic substrate 7 in such a manner that a heat generated by the heating part 9 mounted on the electronic substrate 7 is transferred and dissipated. The highly heat-transfer base 8 is provided with mounting lugs 10a to 10d for mounting the base 8 on a vehicle body.

A sealant 11 is inserted between the annular circumferential wall part 6 and the base 8 to surround the electronic substrate 7. Integration means is provided on the outside of the sealant 11 in order to fix the annular circumferential wall part 6 on the base 8. Thus the electronic substrate 7 is held between the annular circumferential wall part 6 and the base 8 by this integration means.

In this manner, by using the integration means, the base 8, which is a first heavy body, is directly mounted on the vehicle body and the electronic substrate 7, which is a second heavy body, is directly mounted on the base S. As a result, a heat generated by the heating parts 9 is transferred and dissipated, and vibration resistance at the time of mounting 1s improved. Furthermore, thermal deformation stress of the connector housings 4a, 4b, which are molded members, is not applied onto the electronic substrate 7 by the integration means.

The sealant 11 disposed between the base 8 and the connector housing 4 makes the housing structure waterproof, and the base 8 and the connector housing 4 are integrated by the integration means for improving the vibration resistance.

As described above, the highly heat-transfer base 8 and the cover 1 are integrally mounted inserting the electronic substrate 7 between them. As a result, the heating parts 9 disposed on the electronic substrate 7 can be mounted on the base 8 in such a manner as to transfer the heat without fail. Furthermore, the vibration resistance of the housing structure is improved by mounting the heavy base 8 on the vehicle body.

The sealant 11 inserted between the cover 1 formed of fire retardant resin and the base 8 are tightly fitted on the cover 1 and the base 8 by the integration means. As a result, advantages are obtained such that heat resistance and vibration resistance are superior and the housing structure is hermetically sealed and waterproof without fail.

The cover 1 provided with the connector housings 4a, 4b is formed of a fire retardant resin. This fire retardant resin is composed of polybutyleneterephthalate resin used as base material, and 15 to 40% by weight of glass filler as filler. The base 8 is formed by aluminum die-casting, and an adhesive sealant made of a room-temperature-setting liquid silicone rubber is used as the sealant 11.

Therefore, the molded connector portion is dimensionally stable, and it is possible to flexibly cope with the contact pins 2 press-fitted into the connector housing 4.

PBT (polybutylene terephthalate) contains neither nitrogen nor sulfur that spoils adhesive property of the liquid silicone rubber composing the sealant 11, and there is no problem in adhering the sealant 11 to the base 8.

The annular circumferential wall part 6 is provided with an annular groove 6a in which the sealant 11 is inserted and plural screw holes 12a to 12d located on the outside of the annular groove 6a. The base 8 is provided with an annular protrusion 13 snapped into the annular groove 6a and plural through holes 14 located on the outside of the annular protrusion 13. The integration means is comprised of a fixing screw 15 screwed into the screw holes 12a to 12d through the through hole 14.

This construction is suitable for fixing the connector housing 4 with the fixing screw 15 from underside of the base 8, seal area of the sealant 11 is secured, and the sealant 11 is inserted in the annular groove 6a. Therefore the sealant 11 is suitably fitted. This construction has a further advantage of enlarging the contact area of the sealant thereby sealing the housing more hermetically, even in case of the annular circumferential wall part 6 small in thickness.

Since the fixing screws 15 are located outside the annular groove 6a, there is an advantage that it is not required for the fixing screw 15 parts to be waterproof-treated.

The electronic substrate 7 is so constructed as to be temporarily fixed by press-fitting a press-fitting protrusion 16 provided on the inner wall of the annular circumferential wall part 6 into a mounting hole 17 provided on the electronic substrate 7.

Accordingly, it is possible to temporarily fix the electronic substrate 7 easily onto the cover 1 just by fitting the mounting hole 17 with the press-fitting protrusion 16. As a result, there is an advantage of positioning the contact pins 2 accurately at the time of connecting the contact pins 2 by soldering.

Copper-foil area 18 located on the underside of the electronic substrate 7 is electrically connected to the heating part 9 provided on the upper face of the electronic substrate 7, and a heat-transfer soft insulating layer 19 covers the copper-foil area 18. Furthermore, the base 8 is provided with a heat-transfer protrusion 20, and the mentioned integration means press-fits the soft insulating layer 19 onto the heat-transfer protrusion 20.

As a result, this construction has an advantage of efficiently transferring a heat generated by the heating parts 9 mounted on the electronic substrate 7 to the highly heat-transfer base 8.

Further, employing any room-temperature-setting liquid silicone rubber filled with a heat-transfer filler or a heat-transfer elastic insulating sheet as the soft insulating layer 19 provides an advantage of accurately transferring a heat generated in each of the plural copper-foil areas 18 corresponding to the plural heating parts 9 mounted on the electronic substrate 7 to the highly heat-transfer base 8.

The cover 1 is provided with a column 22, which is provided with a central screw hole 21 with one end thereof blocked, substantially at the central position of the canopy part 5 thereof. The base 8 is provided with a pedestal 23 on which the electronic substrate 7 is placed and a central through hole 24 passing through this pedestal 23 substantially at the central position thereof.

The cover 1, the electronic substrate 7, and the base 8 are integrally formed and reinforced by a central fixing screw 25 screwed into the central screw hole 21 through the mentioned central through hole 24, and a waterproof sealant 26 is applied to the head of the central fixing screw 25.

Thus, at the time of installing the electronic substrate 7 of a relatively large area, the cover 1 and the base 8 are integrally formed and reinforced, thereby improving the vibration resistance, and the central pedestal 23 portion located at the center of the electronic substrate 7 can be utilized as a protrusion for transferring heat of the heating part 9.

The mentioned construction is hereinafter described in more detail.

The highly heat-transfer base 8 formed by aluminum die-casting is provided with the annular protrusion 13 and is also provided with mounting lugs 10a to 10d at four portions. These mounting lugs 10a to 10d are respectively provided with mounting holes 27a to 27d.

Mounting screws not shown in the drawings are inserted in the mounting holes 27a to 27d of the base 8 so that the base 8 is fitted and fixed onto the vehicle body not shown.

The cover 1 formed of, for example, a fire retardant resin, being composed of PBT (polybutyleneterephthalate) as base material and 15 to 40% by weight of glass filler as filler, includes a pair of connector housings 4a and 4b and a large number of bent-type (right angle type) contact pins 2a and 2b press-fitted in the connector housings 4a and 4b.

The annular circumferential wall part 6 and the cover 1 are integrally formed into one body, and this annular circumferential wall part 6 is provided with the annular groove 6a into which the annular projection 13 is snapped. The cover 1 is provided with the canopy part 5 and also with the screw holes 12a to 12d in which the fixing screws 15 are screwed at four corners thereof. In addition, the annular circumferential wall part 6 is provided with a partition wall 28.

Further, the central screw hole 21 is disposed at an end part of the column 22 located substantially at the central position of the canopy part 5, and the central fixing screw 25 is screwed in this central screw hole 21.

The heating parts 9 are mounted on the electronic substrate 7 made of, for example, glass epoxy material, on which a large number of electronic parts 9 are mounted. The mentioned large number of contact pins 2a and 2b are connected to the electronic substrate 7 by soldering.

Referring to FIG. 5, the press-fitting protrusion part 16 located on the annular circumferential wall part 6 is press-fitted into the mounting hole 17 provided on the electronic substrate 7. The canopy part 5 is provided with the column 22 substantially at the central position thereof, and the column 22 is provided with the central screw hole 21 at the end part thereof.

The base 8 is provided with the pedestal 23 substantially at the central position thereof, and the pedestal 23 is provided with the central through hole 24. Further, the electronic substrate 7 is provided with a mounting hole 29 substantially at the central position thereof.

The central fixing screw 25 passes through the mounting hole 29 from the central through hole 24 and is screwed into the central screw hole 21, and the waterproof sealant 26 is applied to the head of the central fixing screw 25.

Referring to FIG. 6, the base 8 is provided with the through holes 14 at four corners thereof, and the annular circumferential wall part 6 is provided with a screw hole 12d through a metal insert 30 integrally formed at four corners of the circumferential wall part 6. The fixing screw 15 is screwed into the screw hole 12d through the through hole 14.

The sealant 11 is inserted into the annular groove 6a and pressed by the annular protrusion 13. A material such as room-temperature-setting liquid silicone rubber is used as the sealant 11.

Referring now to FIG. 7, the counter-connector 3 is inserted into the connector housings 4a and 4b, and a large number of female pins not shown are inserted in the counter-connector 3 so as to be in contact and fitted with the contact pins 2a and 2b.

The counter-connector 3 is provided with an annular groove 31. This annular groove 31 is so formed as to sandwich the connector housings 4a and 4b, and elastic packing 32 made of a material such as rubber is mounted on inside of the annular groove 31.

Referring now to FIG. 8, the copper-foil area 18 is electrically connected to the heating part 9 mounted on the electronic substrate 7 and is located on the reverse side of the electronic substrate 7. The heat-transfer soft insulating layer 19 is disposed on the underside of the copper-foil area 18, and the heat-transfer protrusion 20 is provided on the base 8.

The soft insulating layer 19 is pressed by fixing the cover 1 onto the base 8 with the fixing screw 15 and is in contact with the heat-transfer protrusion 20 for transfer and dissipation of heat.

Heat generated by the heating parts 9 is transferred to the copper-foil area 18 through a connecting lead wire 33, through-hole-plated portion formed between double-sided substrate, and so on.

In the housing structure of above construction, a large number of electronic parts including the mentioned many heating parts 9 are packaged on the electronic substrate 7. Then, after the mounting hole 17 of the electronic substrate 7 being press-fitted and temporarily fixed onto the press-fitting protrusion 16 of the cover 1, into which the mentioned large number of contact pins 2a and 2b are press-fitted, the contact pins 2a and 2b are soldered onto the electronic substrate 7 using a jet soldering apparatus or the like.

Subsequently, after the adhesive sealant 11 made of a material such as room-temperature-setting liquid silicone rubber being injected into the annular groove 6a with the canopy part 5 side of the cover 1 facing downward, the base 8 is placed on the cover 1, and the electronic substrate 7, the base 8, and the cover 1 are screwed up together and integrally fixed by the fixing screw 15 and the central fixing screw 25.

Thereafter, the waterproof sealant 26 is applied in order to waterproof the head of the central fixing screw 25.

In the mentioned assembling process, since the electronic substrate 7 is press-fixed onto the base 8 by the annular circumferential wall part 6 with the use of the fixing screw 15, thermal deformation stress of the cover 1 does not cause any distortion of the electronic substrate 7 even when such stress acts thereon.

Likewise, the electronic substrate 7 is free from vibration load acting on the cover 1.

At the time of mounting a finished product on a vehicle body, the product is placed and fixed through the mounting lugs 10a to 10d of the mechanically strong and heavy base 8, and then the counter-connector 3 is inserted in the connector housings 4a and 4b at the time of wiring work.

While the construction described above shows an example where an adhesive sealant composed of liquid silicone rubber is used as the sealant 11, it is also preferable to use elastic packing composed of an annular rubber band instead. In the case of using such elastic packing, although additional parts are required, disassembling work in maintenance becomes easier.

It is also preferable to temporarily fix the cover 1 onto the electronic substrate 7 by means of a screw instead of press fitting.

Further, it is also preferable that a room-temperature-setting liquid silicone rubber filled with a heat-transfer filler such as alumina, silica, etc. or a heat-transfer elastic insulating sheet is used as the heat-transfer soft insulating layer 19.

Although the fixing screws 15 are inserted from the base 8 side to the cover 1 side in the foregoing example, it is also preferable that a screw hole is provided on the base 8 side and a fixing screw is inserted from the cover 1 side to the base 8 side.

What is claimed is:

1. A housing structure of vehicle-mounted electronic equipment comprising:
   a connector housing into which a large number of contact pins are press-fitted and a counter-connector is inserted;
   a cover in which a canopy pan and an annular circumferential wall part are integrally formed by a fire retardant resin filled with glass filler;
   an electronic substrate temporarily fixed onto an inner wall of said annular circumferential wall part, and to which said contact pins are connected; and
   a highly conductive heat-transfer base that is disposed in contact with said electronic substrate so that a heat generated by the heating part mounted on said electronic substrate is transferred and dissipated, and which is provided with mounting lugs for mounting the base on a vehicle body;
   wherein said annular circumferential wall part is provided with an annular groove in which a sealant is inserted and plural screw holes located at the outside of said annular groove;
   said base is provided with an annular protrusion snapped into said annular groove and has plural through holes located at the outside of said annular protrusion; and
   by inserting fixing screws into said screw holes through said through holes, said electronic substrate is held between said annular circumferential wall part and said base.

2. The housing structure of vehicle-mounted electronic equipment according to claim 1, wherein said electronic substrate is temporarily fixed by press-fitting a protrusion part provided on the inner wall of said anfuilar circumferential wall part into a mounting hole provided on said electronic substrate.

3. The housing structure of vehicle-mounted electronic equipment according to claim 1,
   wherein said cover integrally formed with said connector housing is composed of a fire retardant resin, comprising polybutyleneterephthalate resin which is filled with 15 to 40% by weight of glass filler;
   wherein said base is manufactured by aluminum die-casting;
   wherein an adhesive sealant made of a room-temperature-setting liquid silicone rubber is used as said sealant.

4. The housing structure of vehicle-mounted electronic equipment according to claim 1,
   wherein said canopy part is provided with a column having a central screw hole with one end blocked at a central position thereof; said base is provided with a pedestal, on which the electronic substrate is placed, and a central through hole passing through said pedestal substantially at the central position thereof; said cover, said electronic substrate, and said base are integrally formed and reinforced by a central fixing screw inserted into said central screw hole through said central through hole; said electronic substrate is sandwiched between an end part of said pedestal and an end part of said column; and a waterproof sealant is applied to a head of said central fixing screw.

5. The housing structure of vehicle-mounted electronic equipment according to claim 1, further comprising:
   a copper-foil area that is electrically connected to the heating part mounted on said electronic substrate and disposed on the underside of said electronic substrate; a heat-transfer soft insulating layer that covers said copper-foil area; and a heat-transfer protrusion provided on said base.

6. The housing structure of vehicle-mounted electronic equipment according to claim 1, further comprising:
   a copper-foil area that is electrically connected to the heating part mounted on said electronic substrate and disposed on the underside of said electronic substrate; a heat-transfer soft insulating layer that covers said copper-foil area; and a heat-transfer protrusion provided on said base;
   wherein said soft insulating layer is composed of a room-temperature-setting liquid silicone rubber filled with a heat-transfer filler.

7. The housing structure of vehicle-mounted electronic equipment according to claim 1, further comprising:
   a copper-foil area that is electrically connected to the heating part mounted on said electronic substrate and disposed on the underside of said electronic substrate; a heat-transfer soft insulating layer that covers said copper-foil area; and a heat-transfer protrusion provided on said base;
   wherein said soft insulating layer is composed of a heat-transfer elastic insulating sheet.

8. A housing structure comprising:
   a connector housing into which a plurality of contact pins are press fitted;
   a cover integrally formed with said connector housing and which has a canopy part and an annular circumferential wall part;
   an electronic substrate connected to said contact pins and fixed onto an inner wall of said annular circumferential wall part;

a highly heat conductive base disposed in contact with said electronic substrate for dissipating heat from a heating part on said electronic substrate and provided with mounting lugs for mounting the base;

wherein said annular circumferential wall part has an annular groove and a plurality of screw holes located outside of said annular groove;

wherein said base has an annular protrusion snapped into said annular groove for retaining a sealant, and has a plurality of through holes located outside said annular protrusion;

wherein by inserting fixing screws into said screw holes through said through holes said electronic substrate is held between said annular circumferential wall part and said base.

9. The housing structure according to claim 8, wherein said electronic substrate is temporarily fixed by press-fitting a protrusion part provided on the inner wall of said annular circumferential wall part into a mounting hole provided on said electronic substrate.

10. The housing structure according to claim 8, wherein said cover is composed of a fire retardant resin; said base is manufactured by aluminum diecasting, and said sealant is an adhesive sealant made of room temperature setting liquid silicone rubber.

11. The housing structure according to claim 8, further comprising:

a copper foil area that is electrically connected to said heating part and disposed on said electrical substrate on a side opposite said heating part;

a heat transfer protrusion on said base; and a soft insulating layer disposed between said copper foil area and said heat transfer protrusion.

12. The housing structure according to claim 11, wherein said soft insulating layer is a room temperature setting liquid silicone rubber with a heat transfer filler or a heat transfer elastic insulating sheet.

* * * * *